(12) United States Patent
Shibata et al.

(10) Patent No.: US 7,732,996 B2
(45) Date of Patent: Jun. 8, 2010

(54) PIEZOELECTRIC THIN FILM DEVICE

(75) Inventors: Kenji Shibata, Tsukuba (JP); Fumihito Oka, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 12/358,344

(22) Filed: Jan. 23, 2009

(65) Prior Publication Data
US 2009/0189482 A1 Jul. 30, 2009

(30) Foreign Application Priority Data
Jan. 24, 2008 (JP) ............................. 2008-013974

(51) Int. Cl.
*H01L 41/187* (2006.01)
(52) U.S. Cl. ...................................... 310/358
(58) Field of Classification Search ................ 310/358, 310/311, 359; 252/62.9 PZ, 62.9 R; 29/25.35; 428/332; *H01L 41/187, 41/083*
See application file for complete search history.

(56) References Cited

U.S. PATENT DOCUMENTS
2008/0303377 A1* 12/2008 Oka et al. ................. 310/358
2009/0302715 A1* 12/2009 Shibata et al. ............. 310/358

FOREIGN PATENT DOCUMENTS
JP 2005-203725 7/2005

OTHER PUBLICATIONS

Takuya Mino, et al., Piezoelectric Properties of Epitaxial NaNbO3 Thin Films Deposited on (001) SrRuO3/Pt/MgO Substrates, Japanese Journal of Applied Physics, 2007, vol. 46, No. 10B, pp. 6960-6963.

* cited by examiner

*Primary Examiner*—Walter Benson
*Assistant Examiner*—Karen B Addison
(74) *Attorney, Agent, or Firm*—Antonelli, Terry, Stout & Kraus, LLP.

(57) ABSTRACT

A piezoelectric thin film device according to the present invention comprises a lower electrode, a piezoelectric thin film and an upper electrode, in which the piezoelectric thin film is formed of an alkali niobium oxide-based perovskite material expressed by $(K_{1-x}Na_x)NbO_3$ (0<x<1), and in which dependency of the piezoelectric constant $d_{31}$ of the piezoelectric thin film on applied electric field [=|($d_{31}$ under 70 kV/cm)–($d_{31}$ under 7 kV/cm)|/|$d_{31}$ under 70 kV/cm|] is 0.20 or less.

4 Claims, 6 Drawing Sheets

FIG. 4

| | | COMPARATIVE EXAMPLE 1 | COMPARATIVE EXAMPLE 2 | COMPARATIVE EXAMPLE 3 | COMPARATIVE EXAMPLE 4 | COMPARATIVE EXAMPLE 5 | COMPARATIVE EXAMPLE 6 | EXAMPLE 1 | EXAMPLE 2 | EXAMPLE 3 | EXAMPLE 4 | PRIOR ART |
|---|---|---|---|---|---|---|---|---|---|---|---|---|
| FORMING CONDITION OF Pt/Ti FILM | Ti ADHESIVE LAYER THICKNESS (nm) | 10 | 5 | 10 | 5 | 5 | 5 | 3 | 2 | 2 | 1 | - |
| | Pt FILM FORMING TEMP. (°C) | 250 | 250 | 300 | 300 | 350 | 350 | 350 | 350 | 400 | 400 | - |
| | $Ar/O_2$ | 90/10 | 90/10 | 98/2 | 98/2 | 95/5 | 97/3 | 100/0 | 99/1 | 100/0 | 99/1 | - |
| OCCUPATION RATIO OF $(001)_{KNN}$ PLANE (%) | | 51 | 55 | 65 | 70 | 73 | 76 | 80 | 82 | 90 | 98 | - |
| GRADIENT OF $d_{31}$ | | 0.3 | 0.28 | 0.25 | 0.23 | 0.22 | 0.22 | 0.2 | 0.18 | 0.14 | -0.007 | - |
| $\|d_{31}\|$ (7 kV/cm) | | 30 | 34 | 36 | 40 | 42 | 44 | 63 | 65 | 70 | 80 | 23 |
| $\|d_{31}\|$ (70 kV/cm) | | 43 | 47 | 48 | 52 | 54 | 57 | 79 | 79 | 81 | 79 | - |

COMPARATIVE EXAMPLE 1
KNN ON Pt / Ti / Si

EXAMPLE 1
KNN ON [STRONGLY $(111)_{Pt}$ ORIENTED Pt] / Ti / Si

|  | EXAMPLE 5 | EXAMPLE 6 | EXAMPLE 7 | EXAMPLE 8 |
|---|---|---|---|---|
| ORIENTATION CONTROL LAYER (THICKNESS) | $LaNiO_3$ (200nm) | $LaNiO_3$ (300nm) | $NaNbO_3$ (200nm) | $(K_{0.2}Na_{0.8})NbO_3$ (200nm) |
| OCCUPATION RATIO OF $(001)_{KNN}$ PLANE (%) | 99 | 99 | 97 | 93 |
| GRADIENT OF $d_{31}$ | 0.06 | -0.02 | 0.08 | 0.11 |
| $|d_{31}|$ (7 kV/cm) | 63 | 67 | 65 | 70 |
| $|d_{31}|$ (70 kV/cm) | 67 | 66 | 71 | 79 |

PIEZOELECTRIC THIN FILM DEVICE

CLAIM OF PRIORITY

The present application claims priority from Japanese patent application serial no. 2008-013974 filed on Jan. 24, 2008, the content of which is hereby incorporated by reference into this application.

BACKGROUND OF THE INVENTION

1. Field of the Invention

The present invention relates to piezoelectric thin film devices using a piezoelectric thin film, more specifically to piezoelectric thin film devices including, on an Si (silicon) substrate, a piezoelectric thin film of an alkali niobium oxide-based perovskite material.

2. Description of Related Art

Piezoelectric materials are used for piezoelectric devices of various applications. For example, they are widely used for functional electronic components such as actuators in which an applied voltage deforms a piezoelectric element thereby providing an actuation function, and sensors for detecting a physical quantity by utilizing, conversely to actuators, a voltage generated by a deformation of a piezoelectric element. As piezoelectric materials for use in such actuators and sensors, there have been widely used lead-based dielectric materials with excellent piezoelectric properties, in particular perovskite structure ferroelectric materials expressed by the general chemical formula: $Pb(Zr_{1-x}Ti_x)O_3$ (often called PZTs). A PZT is typically made by sintering an oxide of its constituent metals.

In the trend toward downsizing and increasing performance of electronic components, there is also a strong demand for piezoelectric devices with smaller size and higher performance. However, as a piezoelectric material made by widely used conventional sintering methods becomes thinner, the following problem comes to the fore. Specifically, as the thickness of a piezoelectric material approaches the order of 10 μm, it becomes comparable to the grain size of the piezoelectric material; therefore, the influence of the grain boundaries can no longer be ignored. This produces problems such as fluctuation in piezoelectric properties and accelerated device degradation. In order to solve such problems by replacing conventional sintering methods, fabrication methods of piezoelectric materials such as those utilizing thin film formation techniques have been researched in recent years. Therefrom, there have been reported PZT films sputtered on an Si substrate for use in high-sensitivity gyro sensors (angular velocity sensors) (e.g., see JP-A-2005-203725).

On the other hand, PZT piezoelectric sintered bulks and PZT piezoelectric thin films contain approximately 60 to 70 mass % of lead; so, it is desired to promote research and development of lead-free piezoelectric materials from an environmental consideration. Various lead-free piezoelectric materials are currently being studied, among which is potassium sodium niobate expressed by the general chemical formula: $(K_{1-x}Na_x)NbO_3$ (0<x<1) (hereinafter also referred to as KNN). A KNN has a perovskite structure and exhibits relatively excellent piezoelectric properties among lead-free piezoelectric materials, and is therefore expected to be a promising lead-free piezoelectric material candidate. A KNN piezoelectric material has excellent piezoelectric properties near x=0.5. And, there is a report that a KNN thin film epitaxially formed on an MgO single crystalline substrate (instead of an Si substrate) exhibits good piezoelectric properties (see Nonpatent Document 1).

Nonpatent Document 1: T. Mino, S. Kuwajima, T. Suzuki, I. Kanno, H. Kotera, and K. Wasa: Jpn. J. Appl. Phys., 46 (2007) 6960.

Such KNN thin films have been attempted to be formed on an Si substrate by other film formation methods such as sputtering and PLD (pulsed laser deposition). However, up to now, KNN thin films on an Si substrate exhibit a relatively low piezoelectric constant $d_{31}$ compared to PZT thin films, and therefore have yet to be applied to high-sensitivity sensors such as gyro sensors. Moreover, in the above Nonpatent Document 1, the KNN piezoelectric thin film is formed on an MgO substrate; however, use of MgO substrates presents a cost disadvantage since they are expensive compared to silicon substrates.

SUMMARY OF THE INVENTION

Under these circumstances, the present invention addresses the above problems. It is an objective of the present invention to provide a piezoelectric thin film device using a KNN thin film formed on an Si substrate which has sufficiently high performance to be applied to gyro sensors and the like.

In order to achieve the objective described above, the present invention is configured as follows.

According to one aspect of the present invention, a piezoelectric thin film device comprises a lower electrode, a piezoelectric thin film and an upper electrode, in which the piezoelectric thin film is formed of an alkali niobium oxide-based perovskite material expressed by $(K_{1-x}Na_x)NbO_3$ (0<x<1), and in which dependency of the piezoelectric constant $d_{31}$ of the piezoelectric thin film on applied electric field [=|($d_{31}$ under 70 kV/cm)−($d_{31}$ under 7 kV/cm)|/|$d_{31}$ under 70 kV/cm|] is 0.20 or less.

In the above aspect of the present invention, the following improvements and modifications can be made.

(i) The piezoelectric thin film has a strong $(001)_{KNN}$ plane diffraction peak which occupies 80% or more of diffraction peaks of the piezoelectric thin film in an X-ray diffraction 2θ/θ measurement to a surface of the piezoelectric thin film.

(ii) The lower electrode is formed of a platinum (Pt) thin film.

(iii) Between the lower electrode and the piezoelectric thin film is interposed a thin film of a material selected from a group consisting of $LaNiO_3$, $NaNbO_3$ and $(K_{1-x}Na_x)NbO_3$ (0<x<1) having a composition ratio x greater than that of the piezoelectric thin film.

ADVANTAGES OF THE INVENTION

According to the present invention, it is possible to provide a piezoelectric thin film device using a KNN thin film formed on an Si substrate which can greatly increase the piezoelectric constant $d_{31}$ under lower applied electric fields by suppressing the dependency of the piezoelectric constant $d_{31}$ on applied electric field to low levels, thus providing sufficiently high performance to be applied to gyro sensors and the like.

BRIEF DESCRIPTION OF THE DRAWINGS

FIG. 4 is a table showing, for Examples 1 to 4 and Comparative examples 1 to 6, forming condition of Pt/Ti film, occupation ratio of $(001)_{KNN}$ plane, and piezoelectric properties of the KNN thin film.

DETAILED DESCRIPTION OF THE PREFERRED EMBODIMENTS

As described above, conventional KNN piezoelectric thin films on an Si substrate did not have sufficient piezoelectric constant $d_{31}$ to be used for gyro sensors. Typically, the piezoelectric constant $d_{31}$ of a piezoelectric thin film is relatively low under lower applied electric fields, while it is considerably higher under higher applied electric fields than under lower applied electric fields. That is, the piezoelectric constant $d_{31}$ of a piezoelectric thin film generally has a strong dependency on applied electric field and tends to increase with increasing applied electric field (i.e., the gradient of the piezoelectric constant $d_{31}$ with respect to applied electric field is positive and large).

Actually, the fact that piezoelectric thin films have low piezoelectric constants $d_{31}$ under lower applied electric fields has been a limiting factor in improving the sensitivity of gyro sensors. Moreover, it is conventionally regarded that such an above-described dependency of the piezoelectric constant $d_{31}$ of a piezoelectric thin film on applied electric field is an essential phenomenon and therefore there is no solution.

Through research and development of strongly preferentially $(001)_{KNN}$ oriented KNN films on an Si substrate by the inventors, it has been achieved a KNN piezoelectric thin film having a piezoelectric constant $d_{31}$ with a weak dependency on applied electric field. In further study of thus obtained piezoelectric thin films, it has been revealed that, by suppressing the dependency of the piezoelectric constant $d_{31}$ on applied electric field $[=|(d_{31}$ under 70 kV/cm$)-(d_{31}$ under 7 kV/cm$)|/|d_{31}$ under 70 kV/cm$|]$ to 0.20 or less, the piezoelectric constant $d_{31}$ (particularly that under relatively low applied electric fields) can be greatly increased compared to those of conventional piezoelectric thin films (which will be detailed later with reference to e.g. FIG. 7).

By using such a lead-free KNN thin film on an Si substrate having such excellent characteristics, a piezoelectric thin film device can be provided with sufficient properties to be applicable to gyro sensors or the like, which conventional arts have had difficulty in providing. In addition, the use of an Si substrate enables the piezoelectric thin film device of the present invention to be readily integrated with semiconductor control circuits therefor or other semiconductor circuits and devices on the same substrate.

A piezoelectric thin film device according to a preferred embodiment of the present invention will be described below with reference to the accompanying drawings. However, the present invention is not limited to the embodiments described herein.

Figure 1:
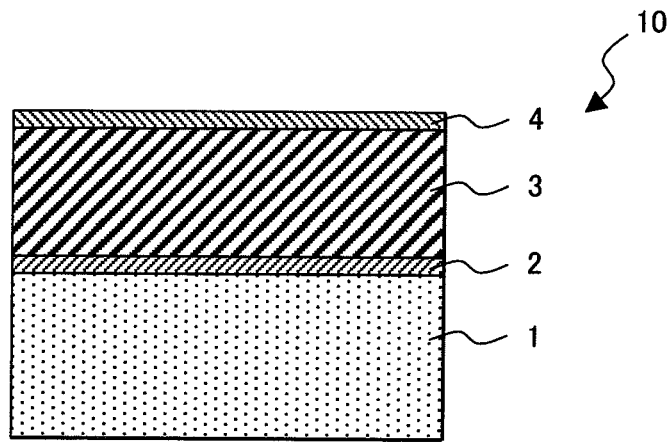
FIG. 1 is a schematic illustration showing a cross-sectional view of a piezoelectric thin film device according to an embodiment of the present invention.

FIG. 1 is a schematic illustration showing a cross-sectional view of a piezoelectric thin film device according to an embodiment of the present invention. As shown in FIG. 1, the piezoelectric thin film device 10 of this embodiment is fabricated by sequentially forming, on an Si substrate 1, a lower electrode 2, a KNN piezoelectric thin film 3 and an upper electrode 4.

The Si substrate 1 is an Si single crystalline substrate having a $(100)_{Si}$ oriented surface (hereinafter "(100) Si substrate"). The Si substrate 1 may have an oxide film ($SiO_2$) formed on its surface in order to electrically insulate the lower electrode 2 and Si substrate 1.

The lower electrode 2 serves as an important underlayer for forming the KNN piezoelectric thin film 3 thereon, and therefore it is preferable to employ Pt (platinum) as the electrode material. This is because Pt films formed on the Si substrate 1 are self-oriented preferentially to a $(111)_{Pt}$ plane. In this embodiment, the lower electrode 2 was formed of a Pt thin film grown by RF (radio frequency) magnetron sputtering. In addition, it is more preferable to provide a Ti (titanium) adhesive layer between the Si substrate 1 and lower electrode 2 in order to enhance the adhesiveness of the lower electrode 2 (see FIG. 3, details are described later).

Unlike the lower electrode 2, the upper electrode 4, which is formed on the KNN piezoelectric thin film 3, does not affect qualities of the piezoelectric film 3. Therefore, there is no particular limitation on the electrode material used. In this embodiment, similarly to the lower electrode 2, the upper electrode 4 was formed of a Pt thin film grown by RF magnetron sputtering.

The KNN piezoelectric thin film 3 is made of an alkali niobium oxide-based perovskite material expressed by the general chemical formula $(K_{1-x}Na_x)NbO_3$ (0<x<1). Preferably, the composition x (=Na/[K+Na]) is approximately 0.5. The KNN piezoelectric thin film 3 can be formed by sputtering, CVD, PLD, sol-gel process, etc. In this embodiment, the KNN piezoelectric thin film 3 was formed by RF magnetron sputtering. And, occupation ratio of the $(001)_{KNN}$ plane diffraction of the KNN piezoelectric thin film 3 is preferably 80% or more in an X-ray diffraction 2θ/θ measurement to a surface of the piezoelectric thin film 3. In addition, to the KNN piezoelectric thin film 3 of this embodiment may be added any one of Ta, Li and Sb, or any combination thereof.

Herein, an evaluation (measurement) method for a state of a crystal grain alignment of the piezoelectric thin film by X-ray diffraction (XRD) is to be described. In an XRD 2θ/θ measurement, a specimen and a detector are scanned by the θ axis, wherein a scanning angle of the specimen is θ and that of the detector is 2θ. According to the 2θ/θ measurement, it can be estimated which crystal plane is a predominant plane at a surface of the piezoelectric thin film. Occupation ratio of the $(001)_{KNN}$ plane of a KNN piezoelectric thin film is determined using diffraction peaks of KNN positioned at an angle 2θ between 20° and 38° in the 2θ/θ measurement. Specifically, the occupation ratio of the $(001)_{KNN}$ plane is defined as below:

Occupation ratio of $(001)_{KNN}$ plane (%)=$[I_{(001)KNN}/\{I_{(001)KNN}+I_{(110)KNN}\}]\times 100$ in which $I_{(001)KNN}$: diffraction peak intensity of $(001)_{KNN}$ plane;
$I_{(110)KNN}$: diffraction peak intensity of $(110)_{KNN}$ plane.

Here, the inventors consider that the X-ray diffraction peak positioned at an angle 2θ between 22.011° and 22.890° can be attributed to the $(001)_{KNN}$ plane. Diffraction peaks due to the Si substrate and lower electrode are excluded from calculation of the occupation ratio of the KNN thin film. Also, it is in order to ensure the exclusion of diffraction peaks such as $(002)_{KNN}$ plane and $(111)_{Pt}$ plane from the calculation that the diffraction angle 2θ is limited to a range between 20° and 38°. Furthermore, the X-ray diffraction in the present invention is always conducted by using the Cu—Kα ray.

On the other hand, the dependency of the piezoelectric constant $d_{31}$ of the KNN piezoelectric thin film 3 on applied electric field (kV/cm) is defined by the expression: $|(d_{31}$ under 70 kV/cm)$-(d_{31}$ under 7 kV/cm)$|/|d_{31}$ under 70 kV/cm$|$, i.e., absolute value of difference between "$d_{31}$ under 70 kV/cm" and "$d_{31}$ under 7 kV/cm" is divided by absolute value of "$d_{31}$ under 70 kV/cm". The piezoelectric thin film 3 is formed so that this dependency value is 0.20 or less.

Figure 2:
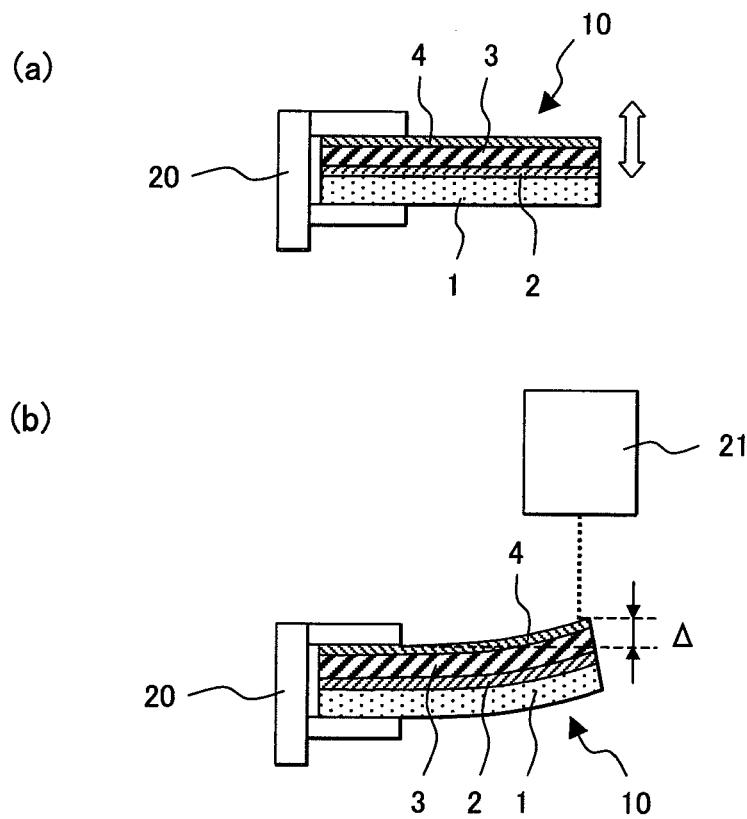
FIGS. 2(a) and 2(b) are schematic illustrations for explaining a measurement method of the piezoelectric constant $d_{31}$ of a piezoelectric thin film device.

The piezoelectric constant $d_{31}$ of the piezoelectric thin film 3 will be now described with reference to FIGS. 2(a) and 2(b). FIGS. 2(a) and 2(b) are schematic illustrations for explaining a measurement method of the piezoelectric constant $d_{31}$ of a piezoelectric thin film device.

Firstly, a rectangular strip is cut from the Si substrate 1 in FIG. 1 to fabricate an elongated piezoelectric thin film device 10. Next, one end of the piezoelectric thin film device 10 is clamped with a clamp 20 and the other end is open to configure a simplified unimorph cantilever (FIG. 2(a)). Then, the KNN piezoelectric thin film 3 is stretched or compressed by applying a voltage between the upper electrode 4 and lower electrode 2, thereby causing the entire cantilever (piezoelectric thin film device 10) to bend. And, the displacement Δ in the vertical direction (the thickness direction of the piezoelectric film 3) at the other end (open end) of the cantilever is measured using a laser Doppler displacement meter 21 (FIG. 2(b)).

The piezoelectric constant $d_{31}$ is calculated from the displacement Δ, the cantilever length, the thicknesses and Young's moduli of the substrate 1 and piezoelectric thin film 3 and the applied electric field (=[applied voltage]/[film thickness]). For details on the $d_{31}$ calculation formula, see reference: I. Kanno, H. Kotera, and K. Wasa: Measurement of transverse piezoelectric properties of PZT thin films, Sens. Actuators A 107 (2003) 68.

The dependency of the piezoelectric constant $d_{31}$ on applied electric field is determined by varying the electric field applied to the piezoelectric thin film 3 of the cantilever. That is, the dependency of the piezoelectric constant $d_{31}$ on applied electric field$[=|(d_{31}$ under 70 kV/cm)$-(d_{31}$ under 7 kV/cm)$|/|d_{31}$ under 70 kV/cm$|]$ can be calculated using the $d_{31}$ values under 70 kV/cm and 7 kV/cm.

By suppressing the dependency of the piezoelectric constant $d_{31}$ of a KNN thin film on applied electric field to 0.20 or less, the piezoelectric constant $d_{31}$, particularly that under relatively low applied electric fields (e.g., 7 kV/cm), can be greatly increased (see FIGS. 4 and 5, details are described later) and, as a result, there can be realized a gyro sensor sensitivity comparable to that of gyro sensors using a conventional PZT thin film.

Further, a piezoelectric KNN thin film having a smaller dependency of the piezoelectric constant $d_{31}$ on applied electric field offers an advantage that, when used as an actuator, the input voltage (or the input electric field) is nearly proportional to the displacement, and therefore no additional control circuits are required. Such a piezoelectric KNN thin film has another advantage of having piezoelectric properties resistance to deterioration with age and therefore a longer service life.

A KNN thin film having a smaller dependency of the piezoelectric constant $d_{31}$ on applied electric field can be achieved by increasing a $(001)_{KNN}$ plane orientation preference thereof. In order to suppress the dependency of the piezoelectric constant $d_{31}$ on applied electric field to 0.20 or less, the occupation ratio of $(001)_{KNN}$ plane diffraction of the KNN thin film in the XRD 2θ/θ measurement is preferably 80% or more. A KNN piezoelectric thin film 3 with a stronger (001) orientation preference can be obtained by, for example, using a highly preferentially $(111)_{Pt}$ plane oriented Pt thin film as the lower electrode 2 underlying the KNN film 3. The highly preferentially $(111)_{Pt}$ plane oriented Pt thin film can be achieved by, for example, making thinner a Ti adhesive layer formed between the Pt thin film and Si substrate, forming the Pt thin film at higher temperatures, or sputtering the Pt thin film in an ambient with lower $O_2$ partial pressure.

A KNN piezoelectric thin film 3 having a smaller dependency of the piezoelectric constant $d_{31}$ on applied electric field can also be achieved by interposing, between the Pt lower electrode 2 and KNN piezoelectric film 3, an orientation control layer such as a $LaNiO_3$ thin film, a $NaNbO_3$ thin film and an Na rich $(K_{1-x}Na_x)NbO_3$ thin film having a composition ratio x greater than that of the KNN piezoelectric thin film 3. The orientation control layer is for enhancing the $(001)_{KNN}$ orientation preference of the KNN piezoelectric thin film 3 formed on the Pt lower electrode 2. By forming such a film (e.g., a $LaNiO_3$ thin film) on the lower electrode 2, a KNN film formed thereon can be made to exhibit a stronger $(001)_{KNN}$ orientation preference than one formed directly on the Pt lower electrode 2.

Referring to FIG. 1 again, a sensor for detecting a physical quantity can be obtained by at least connecting a voltage detecting means between the lower electrode 2 and upper electrode 4. Deformation of the piezoelectric thin film device of this sensor due to a change in some physical quantity will generate a corresponding voltage; thus, various physical quantities can be detected by sensing such voltage. On the other hand, an actuator can be obtained by at least connecting a voltage applying means between the lower electrode 2 and upper electrode 4 in FIG. 1. A voltage application to this sensor will deform the piezoelectric thin film device, thereby enabling actuation of various members. Such sensors include gyro sensors, supersonic sensors, pressure sensors, and velocity/acceleration sensors. And, such an actuator can be used, e.g., in inkjet printers, scanners and supersonic generators.

EXAMPLES

Examples of the invention will be described below, however the present invention is not limited by these examples.

Figure 3:
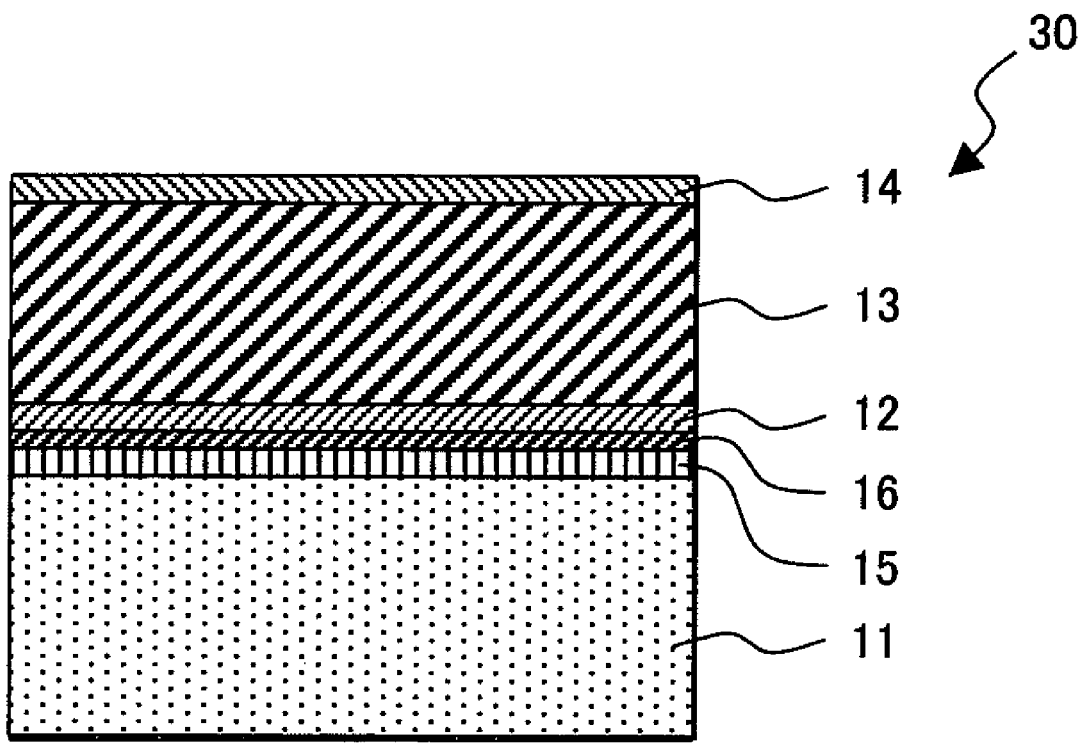
FIG. 3 is a schematic illustration showing a cross-sectional view of the piezoelectric thin film device of Examples 1 to 4 and Comparative examples 1 to 6.

Examples and Comparative Examples of Piezoelectric Thin Film Device Having Structure in FIG. 3

FIG. 3 is a schematic illustration showing a cross-sectional view of the piezoelectric thin film device of Examples 1 to 4 and Comparative examples 1 to 6. The piezoelectric thin film devices 30 of Examples 1 to 4 and Comparative examples 1 to 6 were fabricated by sequentially forming, on an Si substrate 11 (having an $SiO_2$ film 15 on its surface), a Ti adhesive layer 16, a Pt lower electrode 12, a $(K_{0.5}Na_{0.5})NbO_3$ piezoelectric thin film 13, and a Pt upper electrode 14.

Next, the fabrication method of the piezoelectric thin film device of Examples 1 to 4 will be detailed.

As the Si substrate 11, there was used an Si substrate with a thermal oxide layer (an $SiO_2$ film 15) on the substrate surface (($100)_{Si}$ single crystalline substrate of 4-inch round wafer, substrate thickness of 0.5 mm, $SiO_2$ layer thickness of 0.5 μm). Firstly, on the Si substrate 11 was sequentially formed the Ti adhesive layer 16 (thickness of 1 to 3 nm) and the Pt lower electrode 12 (exclusively $(111)_{Pt}$ oriented, thickness of 0.2 μm) by RF magnetron sputtering. The condition of formation of the Ti adhesive layer 16 and Pt lower electrode 12 was as follows: substrate temperature of 350 to 400° C.; discharge power of 200 W; introduced gas of $Ar/O_2$ ($Ar/O_2$=99/1 to 100/0); pressure of 2.5 Pa; and formation time of 1 to 3 min (for the Ti layer 16) and of 10 min (for the Pt electrode 12).

Subsequently, on the Pt lower electrode 12 was formed a 3-μm-thick $(K_{0.5}Na_{0.5})NbO_3$ piezoelectric thin film 13 by RF magnetron sputtering. The condition of formation of the $(K_{0.5}Na_{0.5})NbO_3$ piezoelectric thin film 13 was as follows: sputtering target of sintered $(K, Na)NbO_3$ [composition ratio: $(K+Na)/Nb=1$, $Na/(K+Na)=0.5$]; substrate temperature of 600° C.; discharge power of 100 W; introduced gas of Ar; pressure of 0.4 Pa; and film formation time of 4 h.

On the $(K_{0.5}Na_{0.5})NbO_3$ piezoelectric thin film 13 was further formed a 0.02-μm-thick Pt upper electrode 14 by RF magnetron sputtering. The condition of formation of the Pt upper electrode 14 was as follows: without substrate heating; discharge power of 200 W; introduced gas of Ar; pressure of 2.5 Pa; and film formation time of 1 min.

Next, the fabrication method of the piezoelectric thin film device of Comparative examples 1 to 6 will be detailed.

As the Si substrate 11, there was used the same conditions' Si substrate with a thermal oxide layer 15 as was employed in Examples 1 to 4. First, on the Si substrate 11 was sequentially formed the Ti adhesive layer 16 (thickness of 5 to 10 nm) and the Pt lower electrode 12 (exclusively $(111)_{Pt}$ oriented, thickness of 0.2 μm) by RF magnetron sputtering. The formation conditions of the Ti adhesive layer 16 and Pt lower electrode 12 were as follows: substrate temperature of 250 to 350° C.; discharge power of 200 W; introduced gas of $Ar/O_2$ ($Ar/O_2$=90/10 to 98/2); pressure of 2.5 Pa; and formation time of 5 to 10 min (for the Ti layer 16) and of 10 min (for the Pt electrode 12).

Subsequently, on the Pt lower electrode 12 was sequentially formed a 3-μm-thick $(K_{0.5}Na_{0.5})NbO_3$ piezoelectric thin film 13 and a 0.02-μm-thick Pt upper electrode 14 by RF magnetron sputtering. The conditions of formation of the $(K_{0.5}Na_{0.5})NbO_3$ piezoelectric thin film 13 and Pt upper electrode 14 were the same as those used in Examples 1 to 4.

FIG. 4 is a table showing, for Examples 1 to 4 and Comparative examples 1 to 6, forming condition of Pt/Ti film [(Pt lower electrode 12)/(Ti adhesive layer 16)], occupation ratio of $(001)_{KNN}$ plane, and piezoelectric properties of the KNN thin film. In Examples 1 to 4, in order to cause the Pt thin film to be highly preferentially $(111)_{Pt}$ oriented, the Ti adhesive layer was formed thinner (e.g., 1 to 3 nm) and the Pt film was formed at a higher temperature (e.g., 350 to 400° C.) and a sputtering ambient having a lower $O_2$ concentration was employed (e.g., 0 to 1%) than in Comparative examples 1 to 6.

Figure 5:
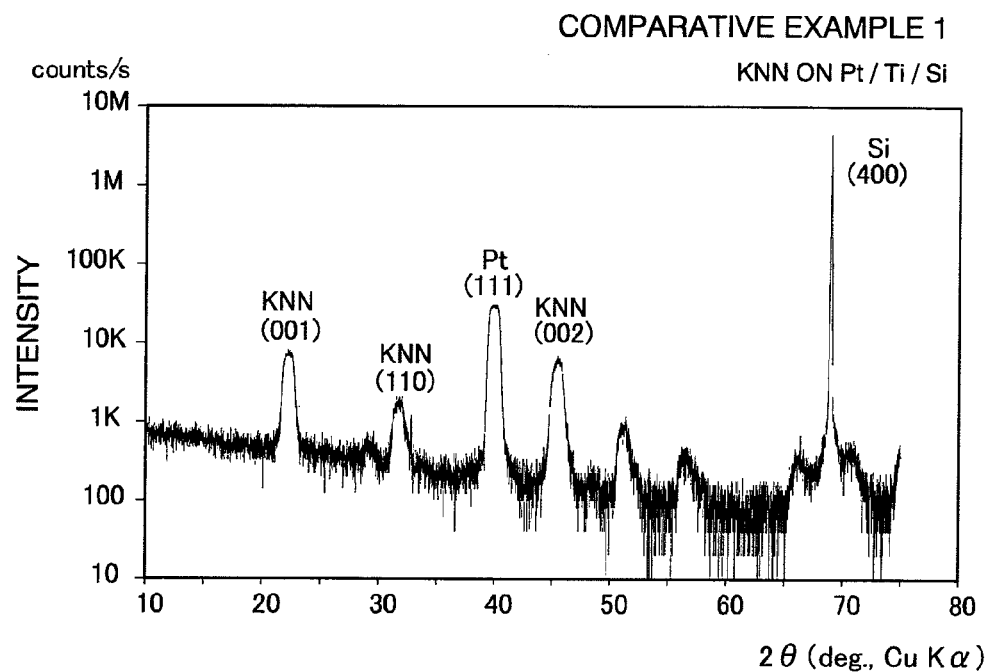
FIG. 5 is an example of a diffraction pattern by an X-ray diffraction 2θ/θ measurement to a surface of the piezoelectric thin film device of Comparative example 1.
Figure 6:
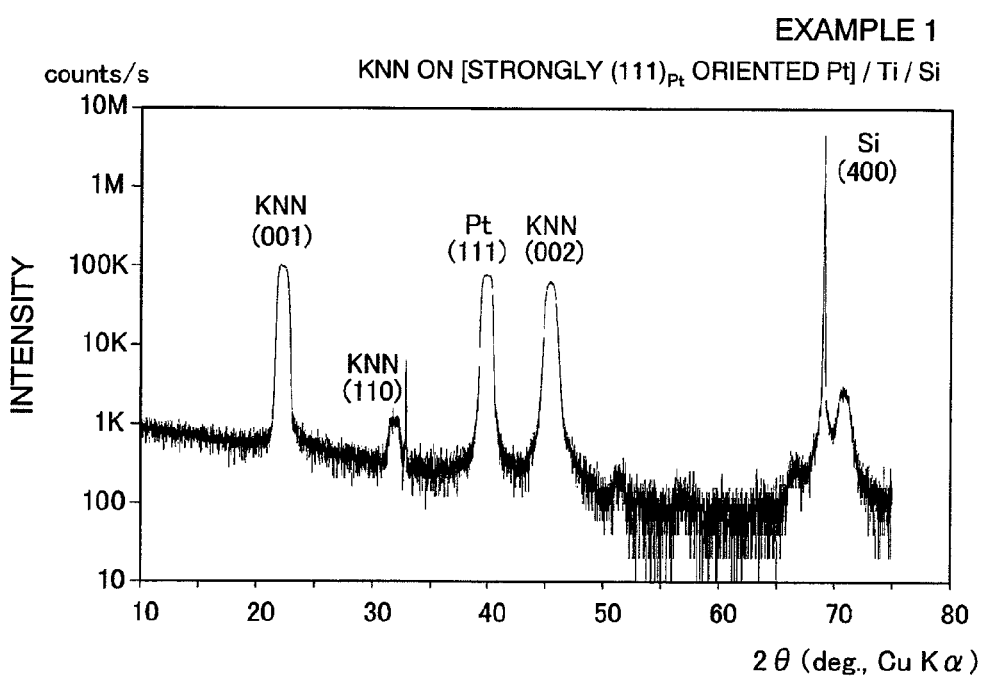
FIG. 6 is an example of a diffraction pattern by an X-ray diffraction 2θ/θ measurement to a surface of the piezoelectric thin film device of Example 1.

Further, in order to examine a state of a crystal grain alignment of the $(K_{0.5}Na_{0.5})NbO_3$ (KNN) piezoelectric thin films 13, an X-ray diffraction 2θ/θ measurement was performed for the piezoelectric thin film devices (of the above Examples and Comparative examples) whose Pt upper electrode 14 had not been formed and whose KNN thin film 13 was therefore exposed. FIG. 5 is an example of a diffraction pattern by an X-ray diffraction 2θ/θ measurement to a surface of the piezoelectric thin film device of Comparative example 1; and FIG. 6 is an example of a diffraction pattern by the X-ray diffraction 2θ/θ measurement to a surface of the piezoelectric thin film device of Example 1. Comparing FIG. 5 with FIG. 6, it can be seen that the KNN thin film 13 of Example 1 exhibits a considerably stronger $(001)_{KNN}$ orientation preference (a higher occupation ratio of $(001)_{KNN}$ plane) than that of Comparative example 1.

In FIG. 4 is shown the occupation ratio of $(001)_{KNN}$ plane of the KNN thin films of Examples 1 to 4 and Comparative examples 1 to 6. The KNN thin films of Examples 1 to 4 exhibit the occupation ratio of $(001)_{KNN}$ plane of as high as 80% or more.

The piezoelectric thin film devices of the above Examples 1 to 4 and Comparative examples 1 to 6 were measured for the piezoelectric constant $d_{31}$. The measurement was done according to the method described above in FIGS. 2(a) and 2(b). For use in the cantilever, a 20-mm-long and 2.5-mm-wide rectangular strip of the piezoelectric thin film device was fabricated. The piezoelectric constant $d_{31}$ was calculated using a Young's modulus of 104 GPa for the KNN piezoelectric thin film 13.

Figure 7:
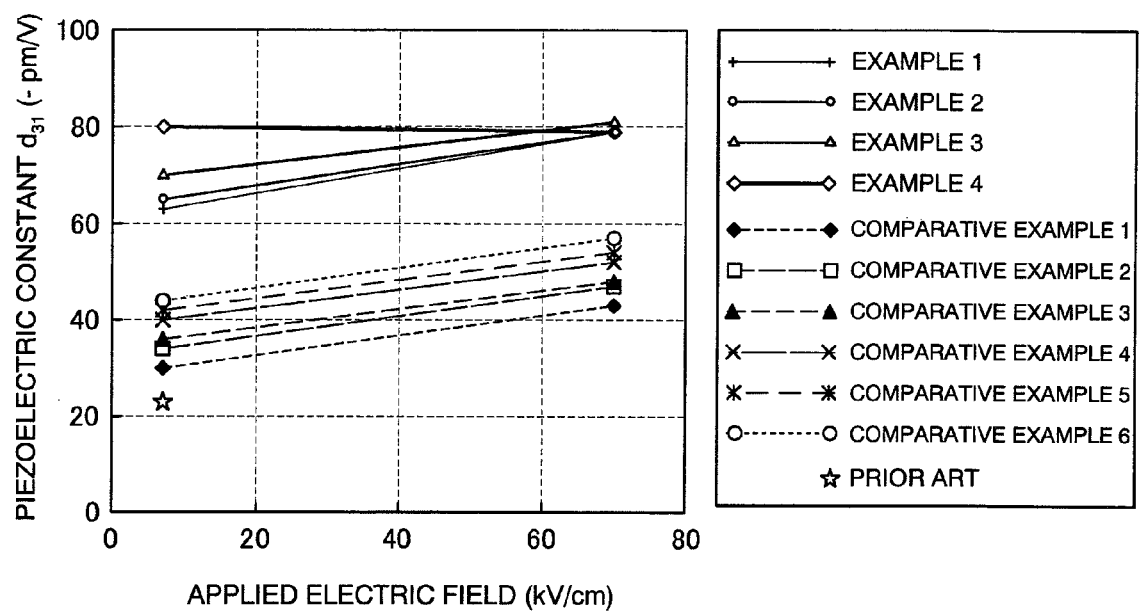
FIG. 7 shows a relationship between piezoelectric constant $d_{31}$ and applied electric field for piezoelectric thin film devices of Example 1 to 4 and Comparative example 1 to 6.

FIG. 7 shows a relationship between piezoelectric constant $d_{31}$ and applied electric field for piezoelectric thin film devices of Examples 1 to 4 and Comparative examples 1 to 6. In FIG. 4 are also shown gradient of the piezoelectric constant $d_{31}[=|(d_{31}$ under 70 kV/cm)$-(d_{31}$ under 7 kV/cm)|/|$d_{31}$ under 70 kV/cm|]; the $d_{31}$ value under 7 kV/cm; and the $d_{31}$ value under 70 kV/cm as piezoelectric properties of the KNN thin film.

For example, the gradient of the piezoelectric constant $d_{31}$ of Example 1 is calculated from: |($d_{31}$ under 70 kV/cm)$-(d_{31}$ under 7 kV/cm)|/|$d_{31}$ under 70 kV/cm|=|(−79 pm/V)−(−63 pm/V)|/|−79 pm/V|]=0.2.

FIGS. 4 and 7 also show the piezoelectric constant $d_{31}$ of a prior art obtained for a KNN film formed on an Si substrate (reported in: Y. Nakashima, W. Sakamoto, H. Maiwa, T. Shimura, and T. Yogo: Jpn. J. Appl. Phys., 46 (2007) L311). The above prior art forms the KNN film by CSD (chemical solution deposition) and probably provides the best data reported in papers for KNN films on Si substrates. In addition, the KNN film of the above prior art has about 50% $(001)_{KNN}$ oriented grains and about 50% $(110)_{KNN}$ oriented grains. The above prior art reports that the $d_{33}$ value is 46 pm/V. In FIG. 4, the prior art $d_{31}$ value is determined to be −23 pm/V using the assumption that "$d_{31}=-d_{33}/2$". As is apparent from Examples 1 to 4 in FIGS. 4 and 7, the piezoelectric constant $d_{31}$, particularly that under relatively low applied electric fields (e.g., 7 kV/cm), can be greatly increased either by suppressing the dependency of the piezoelectric constant $d_{31}$ on applied electric field[=|($d_{31}$ under 70 kV/cm)$-(d_{31}$ under 7 kV/cm)|/|$d_{31}$ under 70 kV/cm|] to 0.20 or less and/or by increasing the occupation ratio of $(001)_{KNN}$ plane to 80% or more.

Figure 8:
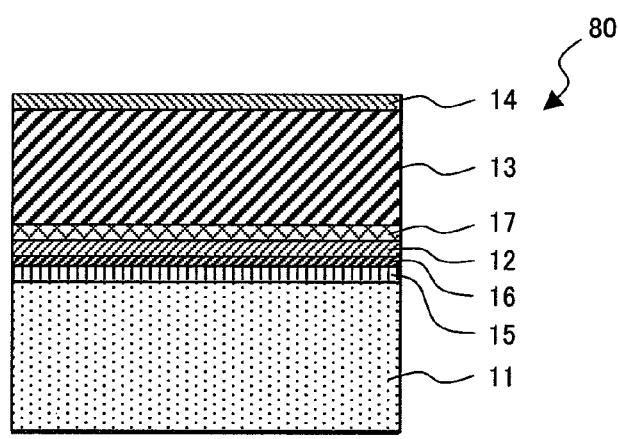
FIG. 8 is a schematic illustration showing a cross-sectional view of the piezoelectric thin film device of Examples 5 to 8.

Examples of Piezoelectric Thin Film Device Having Structure in FIG. 8

Examples of the piezoelectric thin film device having a structure in FIG. 8 will be described below. FIG. 8 is a schematic illustration showing a cross-sectional view of the piezoelectric thin film device of Examples 5 to 8. As shown in FIG. 8, the piezoelectric thin film device 80 of Examples 5 to 8 was fabricated by sequentially forming, on an Si substrate 11 (having an $SiO_2$ film 15 on its surface), a Ti adhesive layer 16, a Pt lower electrode 12, an orientation control layer 17, a $(K_{0.5}Na_{0.5})NbO_3$ piezoelectric thin film 13 and a Pt upper electrode 14.

Next, the fabrication method of the piezoelectric thin film device of Examples 5 to 8 will be described.

As the Si substrate 11, there was used the same conditions' Si substrate with a thermal oxide layer 15 as was employed in Examples 1 to 4. Firstly, on the Si substrate 11 was sequentially formed the Ti adhesive layer 16 (thickness of 2 nm) and the Pt lower electrode 12 (exclusively $(111)_{Pt}$ oriented, thickness of 0.2 μm) by RF magnetron sputtering. The formation conditions of the Ti adhesive layer 16 and Pt lower electrode 12 were as follows: substrate temperature of 400° C.; discharge power of 200 W; introduced gas of Ar; pressure of 2.5 Pa; and formation time of 2 min (for the Ti layer 16) and of 10 min (for the Pt electrode 12).

Subsequently, on the Pt lower electrode 12 was formed an orientation control layer 17 (thickness of 200 to 300 nm) by RF magnetron sputtering. As the orientation control layer 17, Examples 5 to 8 respectively used a 200-nm-thick $LaNiO_3$ thin film, 300-nm-thick $LaNiO_3$ thin film, 200-nm-thick $NaNbO_3$ thin film and 200-nm-thick $(K_{0.2}Na_{0.8})NbO_3$ thin film. The condition of formation of the orientation control layer 17 was as follows: sputtering target of sintered $LaNiO_3$ (for Examples 5 and 6), sintered $NaNbO_3$ (for Example 7) and sintered $(K_{0.2}Na_{0.8})NbO_3$ (for Example 8); substrate temperature of 600° C.; discharge power of 100 W; introduced gas of Ar; and pressure of 0.4 Pa.

Then, on the orientation control layer 17 was sequentially formed a 3-μm-thick $(K_{0.5}Na_{0.5})NbO_3$ thin film 13 and a 0.02-μm-thick Pt upper electrode 14 by RF magnetron sputtering. The formation conditions of the $(K_{0.5}Na_{0.5})NbO_3$ thin film 13 and Pt upper electrode 14 were the same as those employed in Examples 1 to 4.

Similarly to Examples 1 to 4, the occupation ratio of (001) $_{KNN}$ plane of the KNN thin films 13 of Examples 5 to 8 were determined by the XRD 2θ/θ measurement. Also, their piezoelectric constants $d_{31}$ were measured using the same method as used in Examples 1 to 4.

Figures 9, 10:
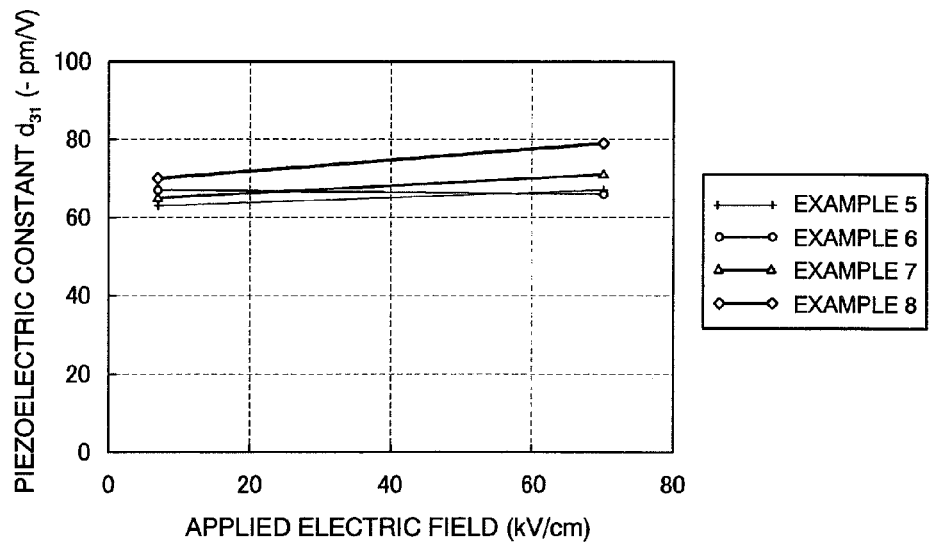
FIG. 9 is a table showing, for Examples 5 to 8, type of an orientation control layer, and occupation ratio of $(001)_{KNN}$ plane and piezoelectric properties of the KNN thin film.
FIG. 10 shows a relationship between piezoelectric constant $d_{31}$ and applied electric field for piezoelectric thin film devices of Examples 5 to 8.

FIG. 9 is a table showing, for Examples 5 to 8, type of an orientation control layer, and occupation ratio of $(001)_{KNN}$ plane and piezoelectric properties of the KNN thin film. Further, FIG. 10 shows a relationship between piezoelectric constant $d_{31}$ and applied electric field for piezoelectric thin film devices of Examples 5 to 8.

As can be seen from Examples 5 to 8 in FIGS. 9 and 10, the interposition of the orientation control layer 17 causes the occupation ratio of $(001)_{KNN}$ plane to be as strong as 93% or more, and also further reduces the dependency of the piezoelectric constant $d_{31}$ on applied electric field[=|$(d_{31}$ under 70 kV/cm)−$(d_{31}$ under 7 kV/cm)|/|$d_{31}$ under 70 kV/cm|] to as low as 0.11 or less while still exhibiting a high $d_{31}$ value under 7 kV/cm.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A piezoelectric thin film device, comprising: a lower electrode, a piezoelectric thin film and an upper electrode, wherein:

the piezoelectric thin film is formed of an alkali niobium oxide-based perovskite material expressed by $(K_{1-x}Na_x)NbO_3$ (0<x<1), and wherein:

dependency of the piezoelectric constant $d_{31}$ of the piezoelectric thin film on applied electric field [=|$(d_{31}$ under 70 kV/cm)−$(d_{31}$ under 7 kV/cm)|/|$d_{31}$ under 70 kV/cm|] is 0.20 or less.

2. The piezoelectric thin film device according to claim 1, wherein:

the piezoelectric thin film has a strong $(001)_{KNN}$ plane diffraction peak which occupies 80% or more of diffraction peaks of the piezoelectric thin film in an X-ray diffraction 2θ/θ measurement to a surface of the piezoelectric thin film.

3. The piezoelectric thin film device according to claim 1, wherein:

the lower electrode is formed of a platinum thin film.

4. The piezoelectric thin film device according to claim 1, wherein:

between the lower electrode and the piezoelectric thin film is interposed a thin film of a material selected from a group consisting of $LaNiO_3$, $NaNbO_3$ and $(K_{1-x}Na_x)NbO_3$ (0<x<1) having a composition ratio x greater than that of the piezoelectric thin film.

* * * * *